United States Patent [19]

Einzinger

[11] Patent Number: 4,506,285

[45] Date of Patent: Mar. 19, 1985

[54] SUBSTRATE MADE OF VARISTOR MATERIAL HAVING A PLURALITY OF ELECTRONIC COMPONENTS MOUNTED THEREON

[75] Inventor: Richard Einzinger, Ruhpolding, Fed. Rep. of Germany

[73] Assignee: Siemens Aktiengesellschaft, Berlin & Munich, Fed. Rep. of Germany

[21] Appl. No.: 516,676

[22] Filed: Jul. 25, 1983

[30] Foreign Application Priority Data

Aug. 20, 1982 [DE] Fed. Rep. of Germany ....... 3231118

[51] Int. Cl.³ ..................... H01L 27/02; H01L 39/02; H01L 23/48
[52] U.S. Cl. ......................................... 357/80; 357/51; 357/70
[58] Field of Search ............... 357/80, 51, 70; 338/21, 338/333, 334; 361/400, 401, 402

[56] References Cited

U.S. PATENT DOCUMENTS

| 3,764,566 | 9/1973 | Matsuoka et al. | 357/1 |
| 3,768,058 | 10/1973 | Harnden | 357/1 |
| 3,805,114 | 4/1974 | Matsuoka et al. | 361/128 |
| 3,896,480 | 7/1975 | Harnden | 357/80 |

FOREIGN PATENT DOCUMENTS 2820118 1/1979 Fed. Rep. of Germany .
2921497 1/1980 Fed. Rep. of Germany .

Primary Examiner—Andrew J. James
Assistant Examiner—M. Prenty
Attorney, Agent, or Firm—Hill, Van Santen, Steadman & Simpson

[57] ABSTRACT

In a combined circuit having varistors, the varistors are contained in portions of a substrate body which consists of zinc oxide, and which has a high resistance due to doping. A varistor property is produced in the portions of the substrate body allocated to the varistors by means of further doping.

7 Claims, 5 Drawing Figures

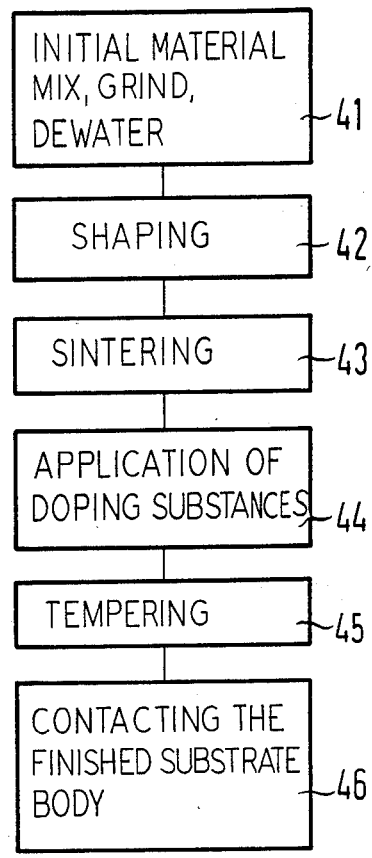
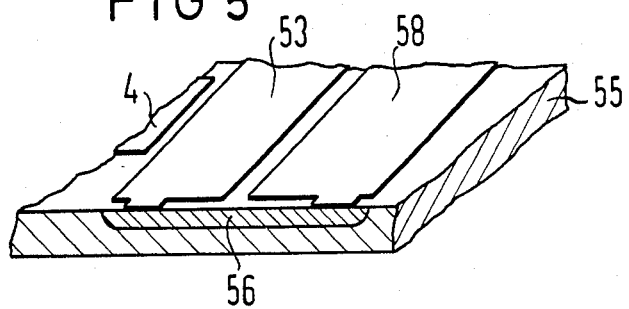

SUBSTRATE MADE OF VARISTOR MATERIAL HAVING A PLURALITY OF ELECTRONIC COMPONENTS MOUNTED THEREON

BACKGROUND OF THE INVENTION

The present invention relates to a combined circuit arrangement wherein a plurality of electronic components are associated with a substrate body.

A circuit arrangement of this type is known from German OS No. 21 20 787, incorporated herein by reference. An integrated circuit is described there consisting of active and passive components exhibiting layers of doping materials for generating active components and conductive contacts, and also exhibiting layers of substances which form insulating layers on the surface of a semiconductor substrate body.

Further layers which can be employed as tracks, resistors, or capacitors can be applied to such an insulating layer. For manufacturing such a circuit arrangement the semiconductor substrate body is provided as a shared substrate body for the active and passive components and screen printing is employed. It is also specified there to apply glasses by means of screen printing, these being placed in their conductive state and back to their initial state by means of a current or voltage surge. Such a glass layer is employed as the source for doping elements for doping diffusions to be performed.

It is known to provide over-voltage devices on circuits—preferably semiconductor circuits—for protection against over-voltages. Thyristors which can be electrically connected to leads of respective circuits are particularly suitable for this purpose.

Varistors are preferably components consisting of doped zinc oxide ceramic having electrodes situated at or on the ceramic body (See U.S. Pat. No. 3,805,114, incorporated herein by reference). Given a low voltage thereacross, a varistor exhibits high-resistance behavior and only exhibits a lower resistance given a higher voltage. With such a component, current I and voltage U depend upon one another according to the equation $I=(U/K)\alpha$, where K is a material constant and $\alpha$ is the coefficient of non-linearity. A zinc oxide ceramic body of a varistor can have the electrical varistor property throughout. Also known, however, are varistors wherein only a layer region of the zinc oxide ceramic body exhibits the varistor property (See German OS No. 28 20 118 and German OS No. 29 21 497, both incorporated herein by reference). The zinc oxide of the remaining part of the ceramic body of such a varistor is always a low-resistance independent of voltage.

A voltage-independent, low-resistance zinc oxide ceramic body is first manufactured by means of mixing starting materials, grinding the slip or mixture, compressing into molded bodies, and sintering the molded bodies. The varistor property is then subsequently achieved by means of in-diffusion of one or more of the doping substances such as, for example, bismuth oxide, boron oxide, cobalt oxide, antimony oxide, chrome oxide, titanium oxide, praseodymium oxide, calcium oxide and other substances.

In conjunction with the employment of circuits which for example are pure semiconductor circuits, hybrid circuits and/or circuits of a different structure, the object is always to achieve over-voltage protection with a structure as low in inductance as possible given the smallest possible space requirement. Inductive portions of the over-voltage protection lead to a reduction of the protective effect given over-voltages having a high rise rate. Furthermore, a respective new circuit arrangement should be manufacturable with the technological means and methods which have already been previously employed and for which the production plants have been equipped.

SUMMARY OF THE INVENTION

It is an object of the present invention to provide a combined circuit arrangement on a common substrate comprising one or more integrated circuits with possibly other components, and of one or more varistors connected to the circuit arrangement by low-inductance paths. The circuit arrangement and the varistors can be compatibly manufactured and require as little space as possible.

This object is achieved in a combined circuit arrangement wherein a plurality of electronic components are provided in association with a substrate body. At least one of the components is disposed on the substrate body and is electrically conductively connected to at least one further component which is formed in a sub-region of the substrate body. The substrate body comprises a zinc oxide ceramic and the sub-region of the substrate body is designed as ceramic having varistor properties and is provided with two electrodes which are disposed on at least one surface of the sub-region so as to form said further component. Other regions of the substrate body are provided substantially electrically insulating relative to portion of the substrate body in the sub-region. Such combined circuit arrangements of the invention can be manufactured in a particularly advantageous manner wherein a plate-shaped substrate body is first produced of zinc oxide ceramic with a dopant making the ceramic substantially electrically insulating, said dopant having been added to the initial material zinc oxide being used in the production of the substrate body. Surface portions of the substrate body provided for varistors are covered with a pasty mixture of doping materials. A varistor property is produced in the ceramic material of the substrate body below the covered surface components in a tempering process at temperatures between 750°–1380° C. for 0.1 to 2 hours.

The invention proceeds from the idea that the varistor which is to be provided in combination with further components should also be a component integrated in a common substrate in the combination. A carrier or substrate body is provided for the combined circuit arrangement formed, for example, of a plurality of inter-related integrated circuits and further components in the substrate body. The required varistor or varistors are provided in this substrate body. Instead of employing low-resistance zinc oxide ceramic for manufacturing a varistor as in the prior art previously described, it is provided according to the invention to employ an electrically insulating or high-resistance zinc oxide ceramic for the substrate body used in forming the varistor. Such a ceramic can in fact, as explained below, be manufactured.

One or more integrated circuits and further components under given conditions, and corresponding electrical tracks, are situated on the insulating substrate body comprised of zinc oxide. The electrical connections between an integrated circuit and the tracks are preferably wire-connections which are produced with standard machines. Surface parts of the insulating zinc oxide substrate body provided according to the invention which are required neither for integrated circuits nor for tracks are available for the one or more varistors. Surface parts or interior parts of the substrate body on which one or more integrated circuits and, under given conditions other components, are at least partially situated can also be employed for the one or more varistors. This is particularly favorable when, for example, such a circuit is situated on or above the ground electrode of the varistor, wherein the ground electrode also effects shielding for the circuit lying above.

The zinc oxide material below such surface parts is converted from the previous electrically insulating condition into a condition with a varistor property by means of indiffusion of the doping materials as cited above. It is advantageous, particularly for protection against over-voltages with high energy, to convert the substrate body into a varistor property over its entire thickness below the respective surface part of the substrate body. In such a case, the varistor then exists between an electrode on such a surface part of the front side of the substrate body and a cooperating electrode on the opposite backside of the substrate body.

BRIEF DESCRIPTION OF THE DRAWINGS

FIG. 4 is a flow chart relating to a manufacturing method according to the invention; and FIG. 5 is a further embodiment of the invention.

DESCRIPTION OF THE PREFERRED EMBODIMENTS

Figure 1:
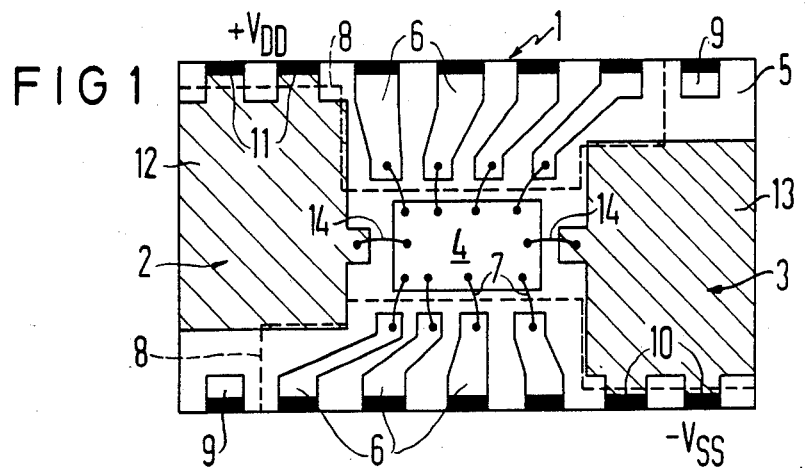
FIG. 1 illustrates a combined circuit arrangement of the invention.

Reference numeral 1 in FIG. 1 shows an example of a combined circuit arrangement according to the invention with two varistors 2 and 3 and an integrated circuit 4. This integrated circuit 4 is, for example, a semiconductor lamina in which the electronic structures are situated and which is applied to the upper surface (in FIG. 1) of the substrate body 5 consisting of electrically insulating zinc oxide ceramic. Tracks 6 which extend up to the respectively adjacent edge of the substrate 5 are provided and form terminal contacts there. These tracks extend close to the circuit 4 and are electrically connected to the corresponding contacts of circuit 4 by means of wire connections 7.

The zinc oxide material of the substrate body 5 below these surface parts of the varistors 2 and 3 emphasized by means of shading is provided with the desired resistance vs. applied voltage relationship (varistor property). In accordance with a manufacturing method selected for the invention, the portion of the substrate to be used for the varistor and which is electrically insulating as a result of employing high-resistance zinc oxide material, is converted into a material having the varistor property by means of doping.

The two broken lines 8 in FIG. 1 are the boundaries of a metallization applied to the backside of the substrate body 5 which is principally employed as a cooperating electrode for the varistors 2 and 3, and also serves as a back electrical shield of the integrated circuit 4. No metallization (of the backside) is preferably provided at those parts of the backside of the substrate body 5 which lie opposite the tracks applied to the front side of the substrate body 5, this being undertaken in order to avoid unnecessary, additional capacitances.

Should such capacitances, however, be non-disruptive, then further parts of the backside of the substrate body 5 can be metallized insofar as, for example, electrical shielding is desired. As a rule, this back metallization of the substrate body in the region between the lines 8 is connected to ground, the terminal contacts 9 being provided for this purpose. Terminal contacts 10 and 11 of the substrate body are provided for connection to the electrical supply voltage. These contacts 10 and 11 are electrically connected to the electrodes 12 or 13 applied to the front of the substrate body 5, said electrodes 12 or 13 being emphasized by means of shading for purposes of better recognition. These electrodes 12 or 13 are congruent with the aforementioned varistors 2 and 3 insofar as a cooperating electrode 8 lies opposite the electrodes 12, 13 at the backside of the substrate body 5.

The electrical wire connections 14 are provided between the respective varistor and the circuit 4. These connections are extremely short so that their self-inductance is minimum.

Figure 2:
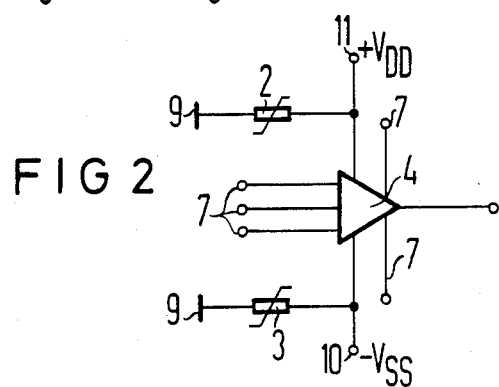
FIG. 2 is a circuit diagram of the arrangement of FIG. 1.

FIG. 2 shows an electrical circuit diagram relating to the structure of FIG. 1. The circuit symbols of FIG. 2 have the same reference characters as the same electronic components in the arrangement of FIG. 1. All the varistors 2 and 3 protecting the circuit 4 against over-voltage are electrically connected in a manner known per se into the overall circuit as can be seen from the circuit diagram of FIG. 2.

An advantage of the arrangement according to the invention as illustrated is that the high self-inductances of the connection lines of the varistors known from the prior art are nearly completely eliminated here so that the varistors can also protect the integrated circuit against very steep overvoltage surges.

Figure 3:
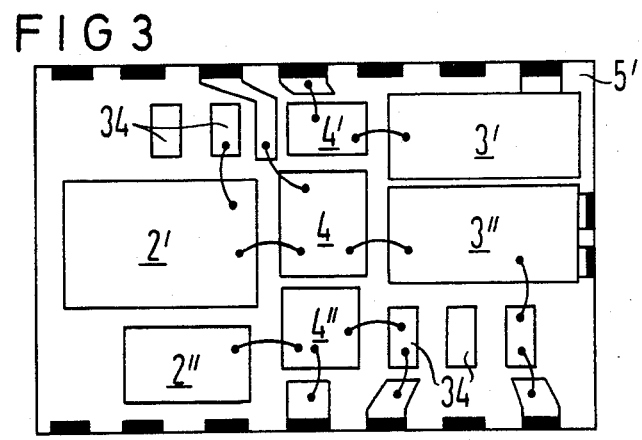
FIG. 3 is a plan view of a hybrid circuit according to the invention.

FIG. 3 shows a plan view of a hybrid circuit according to the invention and having a plurality of integrated circuits 4, 4', 4" and further individual components 34. Corresponding varistors which are integrated components of the substrate body 5' are referenced 2', 2" or, 3', 3". The above individual components can, for example, be multi-layer capacitors, resistors and the like.

The electrically insulating substrate body employed in the invention consists of zinc oxide which has been doped with, for example 1 to 5 weight percent manganese oxide or lithium oxide in order to form a material having a very high specific, electrical resistance.

FIG. 4 shows a flow chart relating to the manufacturing method. Powdery zinc oxide is mixed with the provided manganese oxide in a watery slip or mixture and is ground (41), dewatered and laced with a plastification agent such as, for example, polyviol (6). Plates having thickness dimensions between 0.2 and 1 mm are then produced in the desired size, for example by means of compression molding or by means of a tape drawing method (42). The dried raw plates are then sintered in air (43) at temperatures between 1050° C. and 1200° C. Electrically insulating zinc oxide ceramic thus arises.

The sintered, manufactured plates are now printed (44), for example in a screen-printing method, with a pasty mixture of preferably a plurality of doping oxides and an organic binding agent. The plates are printed in those regions in which the varistors 2, 3 are to later exist. Known oxides employed for varistor ceramics, bizmuth, cobalt, antimony, chrome, titanium, boron, and praseodyminum oxides can be employed. After the printed, pasty mixture has dried, a tempering process

(45) in oxidizing atmosphere at temperatures between 70° and 1250° C. is carried out for 0.1 to 2 hours for producing the integrated varistors 2 and/or 3 (2' ... 3' ...) contained in the substrate body 5, 5'. The oxides diffused into the ceramic material of the substrate body 5 generate electrical conductivity in the previously insulating grain volume or interior and electrically insulating grain edge layers such as fundamentally exist given a known zinc oxide varistor.

The electrode metallizations 12, 13 of the varistors 2, 3 which have been described in detail to FIG. 1 are produced, for example, by means of vapor-deposition, sputtering or screen printing with stoving of corresponding metals (46). The connecting tracks 6 and other contacts and tracks 9, 10, 11 are thus simultaneously produced. A substrate body 5 has thus been finished, ready to be equipped with the corresponding integrated circuits and with additional electronic components as may be required.

FIG. 5 shows a further sample embodiment of an inventive varistor realized in a substrate body. Here, the electrode 53 and cooperating electrode 58 are situated on one and the same surface of the substrate body 55 illustrated by section or detail, said substrate body 55 preferably exhibiting varistor properties only in the portion 56 of its thickness.

Although various minor changes and modifications might be proposed by those skilled in the art, it will be understood that I wish to include within the claims of the patent warranted hereon all such changes and modifications as reasonably come within my contribution to the art.

I claim as my invention:

1. A combined circuit arrangement, comprising:
    a plurality of electronic components;
    a substrate body on which the electronic components are commonly integrated;
    at least one of said components on the substrate body being electrically conductively connected to at least one further component which is formed in a sub-region of the substrate body;
    the substrate body comprising zinc oxide ceramic with a dopant rendering the ceramic electrically insulating;
    the sub-region of the substrate body being designed as ceramic having a decreasing resistance vs. increasing applied voltage varistor property and is provided with two electrodes which are disposed on at least one surface of the sub-region so as to form said one further component; and
    other regions of the zinc oxide ceramic substrate body being provided substantially electrically insulating and having a high resistance relative to a resistance of the sub-region.

2. A combined circuit arrangement according to claim 1 wherein at least one integrated semiconductor circuit electrically connects to the further component having the varistor property at the sub-region of the substrate body.

3. A combined circuit arrangement according to claim 1 wherein all remaining regions of the substrate body other than the sub-region are provided substantially electrically insulating and with a high resistance relative to the resistance of the sub-region.

4. A combined circuit arrangement according to claim 1 wherein one of the electrodes is provided on one surface of the sub-region and the other electrode is provide on an opposite surface of the sub-region.

5. A combined circuit arrangement according to claim 1 wherein both of the two electrodes are disposed on one surface of the sub-region.

6. A combined circuit arrangement according to claim 5 wherein the sub-region is doped so that it faces only one surface of the substrate and does not extend to the other surface.

7. A combined circuit arrangement comprising:
    a substrate body comprising zinc oxide ceramic having a dopant added thereto which makes the ceramic substantially electrically insulating and with a high resistance;
    a sub-region of the substrate body being additionally doped so as to have a decreasing resistance vs. increasing applied voltage varistor property with a lower resistance relative to the other high resistance regions of the substrate body, said sub-region being provided with two electrodes disposed on at least one surface thereof so as to form a varistor; and
    at least one other component not having varistor properties being disposed on the substrate body electrically connected to the varistor.

* * * * *